(12) United States Patent
Ye et al.

(10) Patent No.: US 11,861,098 B2
(45) Date of Patent: Jan. 2, 2024

(54) TOUCH DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Jian Ye, Hubei (CN); Pengfei Liang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 228 days.

(21) Appl. No.: 17/435,042

(22) PCT Filed: Jun. 11, 2021

(86) PCT No.: PCT/CN2021/099635
§ 371 (c)(1),
(2) Date: Aug. 31, 2021

(87) PCT Pub. No.: WO2022/257102
PCT Pub. Date: Dec. 15, 2022

(65) Prior Publication Data
US 2022/0391065 A1 Dec. 8, 2022

(30) Foreign Application Priority Data

Jun. 7, 2021 (CN) .......................... 202110632413.1

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0443* (2019.05); *G06F 3/0446* (2019.05); *H10K 59/353* (2023.02); *H10K 59/40* (2023.02)

(58) Field of Classification Search
None
See application file for complete search history.

(56) References Cited

U.S. PATENT DOCUMENTS

2014/0362031 A1* 12/2014 Mo ..................... G06F 3/04166
 345/174
2019/0171317 A1* 6/2019 Baek ..................... G06F 3/0443
(Continued)

FOREIGN PATENT DOCUMENTS

CN 104516561 A 4/2015
CN 106292022 A 1/2017
(Continued)

*Primary Examiner* — Amare Mengistu
*Assistant Examiner* — Sarvesh J Nadkarni
(74) *Attorney, Agent, or Firm* — Mark M. Friedman

(57) ABSTRACT

The present application provides a touch display panel, which includes: a display panel; and a touch component, wherein the touch component has a first area and a second area corresponding to the display area, and the touch component includes: a plurality of first touch electrode lines disposed in the first area; a plurality of touch electrodes disposed in the second area; and a plurality of second touch electrode lines disposed in the second area, and the second touch electrode lines are connected between the first touch electrode lines and the touch electrodes.

15 Claims, 8 Drawing Sheets

(51) Int. Cl.
H10K 59/40 (2023.01)
H10K 59/35 (2023.01)

(56) References Cited

U.S. PATENT DOCUMENTS

| | | | |
|---|---|---|---|
| 2022/0035487 A1* | 2/2022 | Wang | G06F 3/0412 |
| 2022/0129131 A1* | 4/2022 | Liu | G06F 3/04164 |
| 2022/0164070 A1* | 5/2022 | Kim | G06F 3/0448 |

FOREIGN PATENT DOCUMENTS

| | | | |
|---|---|---|---|
| CN | 107656651 A | | 2/2018 |
| CN | 109377888 A | | 2/2019 |
| CN | 110504287 A | | 11/2019 |
| CN | 110703940 A | | 1/2020 |
| CN | 111930266 A | | 11/2020 |
| CN | 112198990 A | | 1/2021 |
| CN | 113296632 A | | 8/2021 |
| KR | 20010018812 A | | 3/2001 |
| KR | 20170076187 A | | 7/2017 |

* cited by examiner

TOUCH DISPLAY PANEL

BACKGROUND OF DISCLOSURE

Field of Disclosure

The present disclosure relates to the field of display technology, in particular to a touch display panel.

Description of Prior Art

Currently, a lower frame area of a touch display panel is relatively wide, which is not conducive to realization of a narrow frame design of the touch display panel.

Therefore, it is necessary to propose a technical solution to solve a problem of a wide lower frame of the touch display panel.

SUMMARY OF DISCLOSURE

The purpose of the present disclosure is to provide a touch display panel so that the touch display panel realizes a narrow frame design.

A touch display panel, wherein the touch display panel comprises:

a display panel comprising a display area; and a touch component comprising a first area and a second area disposed corresponding to the display area, wherein the first area is disposed adjacent to the second area, and the touch component comprises:

a plurality of first touch electrode lines disposed in the first area;

a plurality of touch electrodes disposed in the second area; and a plurality of second touch electrode lines disposed in the second area, wherein the second touch electrode lines are connected between the first touch electrode lines and the touch electrodes, and an interval between two adjacent second touch electrode lines is greater than a minimum interval between two adjacent first touch electrode lines.

The present disclosure provides a touch display panel, in which the plurality of first touch electrode lines are disposed corresponding to the display area of the display panel, and the second touch electrode lines are connected between the first touch electrode lines and the touch electrodes, and the interval between two adjacent second touch electrode lines is greater than the minimum interval between two adjacent first touch electrode lines, so that a sector area in a traditional technology is set corresponding to the display area, therefore a size of a part of a sector wire area of the touch component corresponding to a non-display area of the display panel is zero or close to zero, which is beneficial for the touch display panel to realize a narrow frame design.

DETAILED DESCRIPTION OF EMBODIMENTS

Technical solutions in the embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

Figure 1:
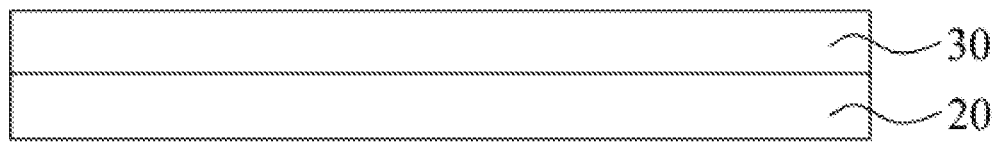
FIG. 1 is a schematic cross-sectional view of a touch display panel according to an embodiment of the present disclosure.

As shown in FIG. 1, which is a schematic cross-sectional view of a touch display panel according to an embodiment of the present disclosure, the touch display panel 100 comprises a display panel 20 and a touch component 30, and the touch component 30 is located on a light-emitting side of the display panel 20.

Figure 2:
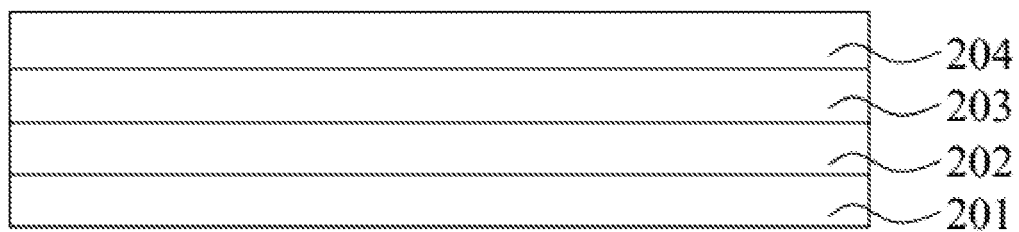
FIG. 2 is a schematic cross-sectional view of a display panel shown in FIG. 1.

In this embodiment, the display panel 20 is an organic light-emitting diode display panel. As shown in FIG. 2, which is a schematic cross-sectional view of the display panel shown in FIG. 1, the display panel 20 comprises a substrate 201, a thin film transistor array layer 202, an organic light-emitting diode array layer 203, and a thin film encapsulation layer 204. The thin film transistor array layer 202 is disposed on the substrate 201, and the thin film transistor array layer 202 comprises a plurality of thin film transistors arranged in an array. The organic light-emitting diode array layer 203 is disposed on the thin film transistor array layer 202, and the organic light-emitting diode array layer 203 comprises a plurality of organic light-emitting diodes arranged in an array. The plurality of organic light-emitting diodes comprise red organic light-emitting diodes, blue organic light-emitting diodes, and green organic light-emitting diodes. The red organic light-emitting diodes are red sub-pixels R, the blue organic light-emitting diodes are blue sub-pixels B, and green organic light-emitting diodes are green sub-pixels G. The thin film encapsulation layer 204 is disposed on the organic light-emitting diode array layer 203. The thin film encapsulation layer 204 comprises a first inorganic layer, a second inorganic layer, and an organic layer located between the first inorganic layer and the second inorganic layer. The first inorganic layer is disposed on the organic light-emitting diode array layer 203.

Figure 3:
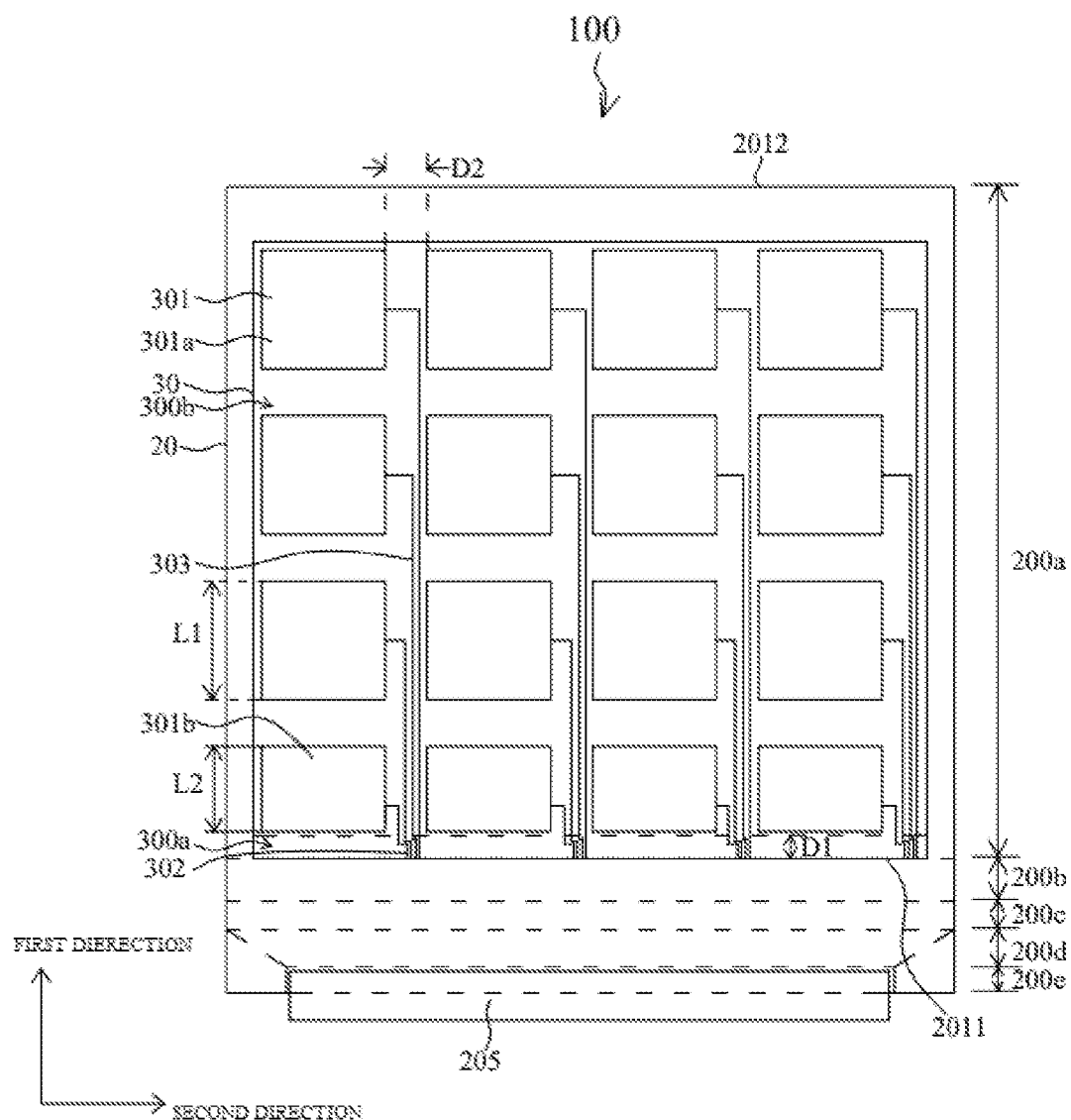
FIG. 3 is a first schematic plan view of the touch display panel according to an embodiment of the present disclosure.
Figure 4:
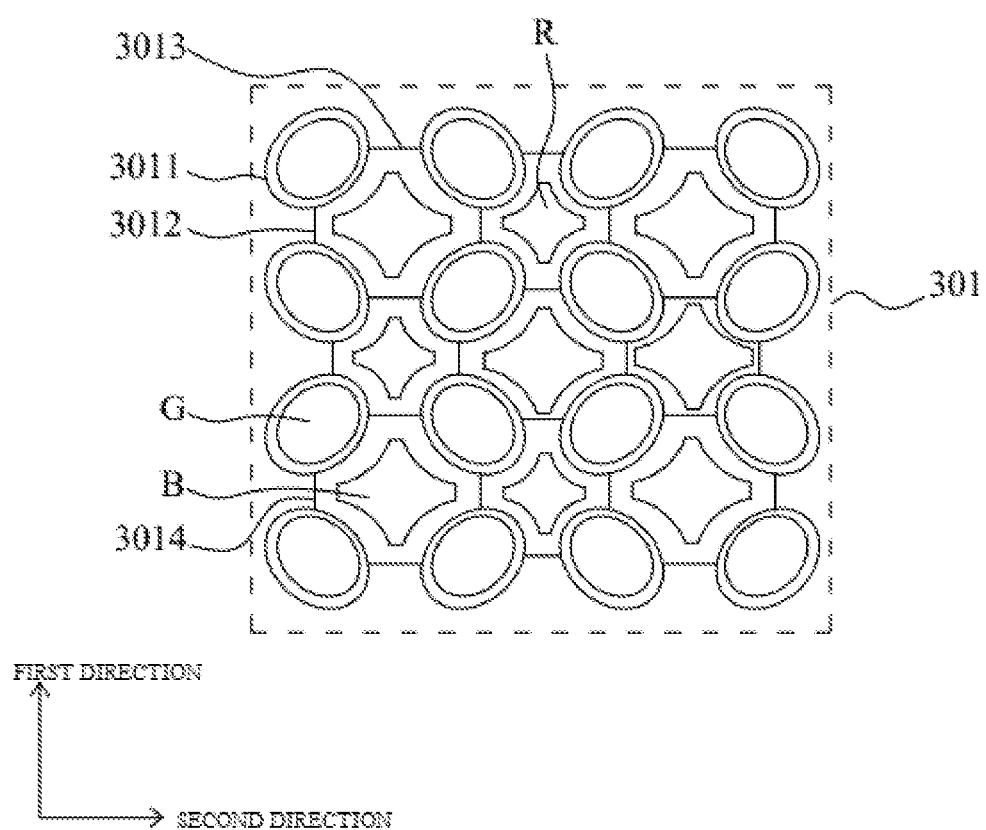
FIG. 4 is a first schematic plan view of touch electrodes surrounding sub-pixels of the display panel according to an embodiment of the present disclosure.
Figure 5:
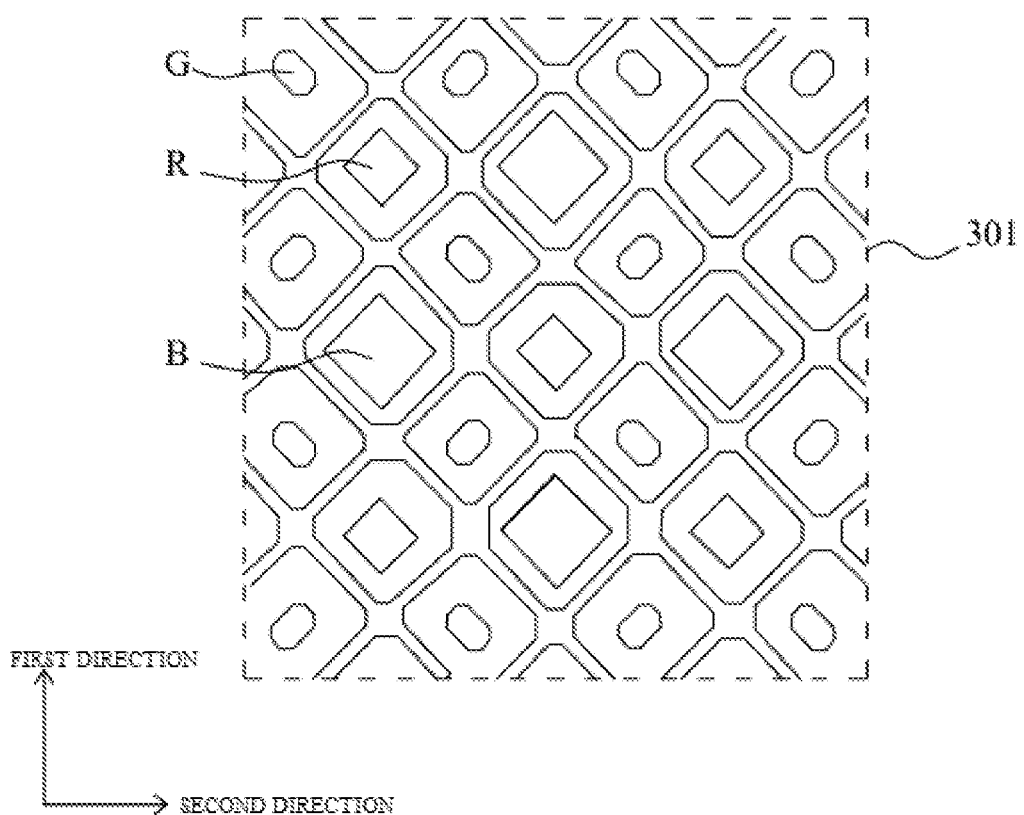
FIG. 5 is a second schematic plan view of touch electrodes surrounding sub-pixels of the display panel according to an embodiment of the present disclosure.

As shown in FIG. 3, which is a first schematic plan view of the touch display panel according to an embodiment of the present disclosure, the display panel 20 comprises a display area 200a, a first sector area 200b, a bending area 200c, a second sector area 200d, and a pad area 200e. The display area 200a, the first sector area 200b, the bending area 200c, the second sector area 200d, and the pad area 200e are arranged in sequence. As shown in FIG. 4 and FIG. 5, the red sub-pixels R, the blue sub-pixels B, and the green sub-pixels G are all disposed in the display area 200a, and the display area 200a is defined by an area where the red sub-pixels R, the blue sub-pixels B, and the green sub-pixels G are disposed. The display area 200a further comprises a plurality of power lines (not shown) and a plurality of data lines (not shown). The plurality of power lines are divided into multiple groups. Each group of power lines comprises a plurality of adjacent power lines, and extends to the first sector area 200b, the bending area 200c, the second sector area 200d, and the pad area 200e in sequence. The plurality of data lines are divided into multiple groups, and each group of data lines comprises a plurality of adjacent data lines, and extends to the first sector area 200b, the bending area 200c, the second sector area 200d, and the pad area 200e in sequence. The pad area 200e is provided with a plurality of input pads (not shown) and a plurality of output pads (not shown), and the plurality of input pads are configured to input power, communication, and control signals required for operation of a touch display driver integrated chip (TDDI) 205. The output pads comprise first output pads that are connected to the data lines and output display data signals, and the output pads further comprise second output pads that are electrically connected to second touch electrode lines and output touch signals. The touch display driver integrated chip 205 is connected to the first output pads and the second output pads.

In this embodiment, the touch component 30 is disposed on the thin film encapsulation layer 204 of the display panel 20. It is understandable that the touch component 30 can also be disposed on an independent substrate, and the touch component 30 is disposed on the display panel 20 through an adhesive layer.

Please continue to refer to FIG. 3, the touch component 30 comprises a first area 300a and a second area 300b. The first area 300a and the second area 300b are arranged adjacent to each other. The second area 300b is greater than the first area 300a, and the first area 300a and the second area 300b are both set corresponding to the display area 200a of the display panel 20, that is, both the first area 300a and the second area 300b overlap the display area 200a of the display panel 20.

The touch component 30 comprises a plurality of touch electrodes 301, a plurality of first touch electrode lines 302, and a plurality of second touch electrode lines 303, and the touch electrodes 301, the first touch electrode lines 302, and the second touch electrodes line 303 are set on a same layer. The plurality of touch electrodes 301 and the plurality of second touch electrode lines 303 are all disposed in the second area 300b, and the plurality of first touch electrode lines 302 are disposed in the first area 300a. One touch electrode 301 and one second touch electrode line 303 are connected one-to-one, one second touch electrode line 303 and one first touch electrode line 302 are connected one-to-one, and the second touch electrode line 303 is connected between the first touch electrode line 302 and the touch electrode 301.

In this embodiment, the plurality of touch electrodes 301 are self-capacitive touch electrodes, and the plurality of touch electrodes 301 are arranged in an array along a first direction and a second direction. A shape of the plurality of touch electrodes 301 is rectangular, and the plurality of touch electrodes 301 may also have other shapes. The first direction is a direction in which the second area 300b points to the first area 300a, and the second direction is perpendicular to the first direction.

As shown in FIG. 4, each touch electrode 301 is composed of a metal grid pattern, and the metal grid pattern is composed of arc-shaped metal lines. Each touch electrode 301 comprises a plurality of elliptical ring patterns 3011, a plurality of first connection portions 3012, and a plurality of second connection portions 3013. In each touch electrode 301, each of the first connection portions 3012 connects two adjacent elliptical ring patterns 3011 in the first direction, and each of the second connection portions 3013 connects two adjacent elliptical ring patterns 3011 in the second direction. Portions of four adjacent elliptical ring patterns 3011, the first connection portions 3012, and the second connection portions 3013 are connected to form an octagonal ring pattern 3014. Each elliptical ring pattern 3011 surrounds the green sub-pixel G, and each octagonal ring pattern 3014 surrounds the blue sub-pixel B or the red sub-pixel R.

As shown in FIG. 5, a touch electrode shown in FIG. 5 is basically similar to the touch electrode shown in FIG. 4, and the touch electrodes 301 are both composed of metal grid patterns. The difference lies in that the metal grid pattern in FIG. 5 is composed of linear metal lines, and the metal grid pattern in FIG. 5 is comprised of quadrilateral ring patterns, and each of the quadrilateral ring patterns surrounds the green sub-pixel G, the red sub-pixel R, or the blue sub-pixel B.

In this embodiment, as shown in FIG. 3, the plurality of touch electrodes 301 comprise first type touch electrodes 301a and second type touch electrodes 301b. In the first direction (a column direction), the first type touch electrodes 301a and the second type touch electrodes 301b are arranged side by side, and a size of the first type touch electrodes 301a is different from a size of the second type touch electrodes 301b. Compared with a same size of touch electrodes in a traditional technology, a size difference design of the touch electrodes in the first direction of the present disclosure makes a portion of the touch component 30 corresponding to the display area 200a of the display panel 20 have an extra space. The extra space is used to lay the plurality of first touch electrode lines 302. The plurality of first touch electrode lines 302 are divided into several groups, and each group of first touch electrode lines 302 are arranged together. A minimum distance between two adjacent first touch electrode lines 302 in each group of first control electrode lines 302 is less than a distance between two adjacent second touch electrode lines 303. In the first area 300a, a distance between two adjacent first touch electrode lines 302 shows a decreasing trend in a direction from the second area 300b to the first area 300a, that is, touch wires arranged in a touch sector area in the traditional technology are disposed corresponding to the display area of the display panel. Compared to the traditional technology in which a size of the touch sector area is greater than a size of a first sector area of a display panel, resulting in a wider lower frame of a touch display panel, the touch component 30 in the embodiment of the present disclosure does not require a separate touch sector area in a non-display area, so that a frame of the touch display panel is narrowed.

In this embodiment, in the first direction, the second type touch electrodes 301b are disposed in a same column as the first type touch electrodes 301a, and each column of touch electrodes 301 comprises at least one first type touch electrode 301a and at least one second type touch electrode 301b. In the second direction, a plurality of first type touch electrodes 301a are arranged in a same row, and a plurality of second type touch electrodes 301b are arranged in a same row, that is, each row of touch electrodes 301 comprises a plurality of first type touch electrodes 301a side by side or a plurality of second type touch electrodes 301b side by side, an interval between any two adjacent columns of touch electrodes 301 in the first direction is the same, and an interval between any two adjacent rows of touch electrodes 301 is the same.

In the first direction, the size of the second type touch electrodes 301b is less than the size of the first type touch electrodes 301a, and the second type touch electrodes 301b are disposed close to a first edge 2011 and/or a second edge 2012, and the first edge 2011 is an edge of a portion of the display panel 20 corresponding to the display area 200a close to the first touch electrode lines 302, and the second edge 2012 is an edge of the portion of the display panel 20 corresponding to the display area 200a opposite to the first edge 2011. Since touch performance requirement of the touch component 30 corresponding to edges of the display panel 20 is lower than touch performance requirement of the touch component 30 corresponding to other areas (such as a middle area) of the display panel 20, the second type touch electrodes 301b are disposed close to the edge of the portion of the display panel 20 corresponding to the display area 200a in the first direction, which helps to prevent the size different design of the touch electrodes from affecting the touch performance of main touch area of the touch component. Specifically, the second type touch electrodes 301b are disposed close to the first edge 2011, and the first type touch electrodes 301a are located at a side of the second type touch electrodes 301b away from the first edge 2011, so that the second type touch electrodes 301b are all disposed close to the first area 300a, which simplifies manufacturing of the touch component 30. The plurality of touch electrodes 301 in FIG. 3 only comprises one row of second type touch electrodes 301b, and the others are all first type touch electrodes 301a.

Figure 6:
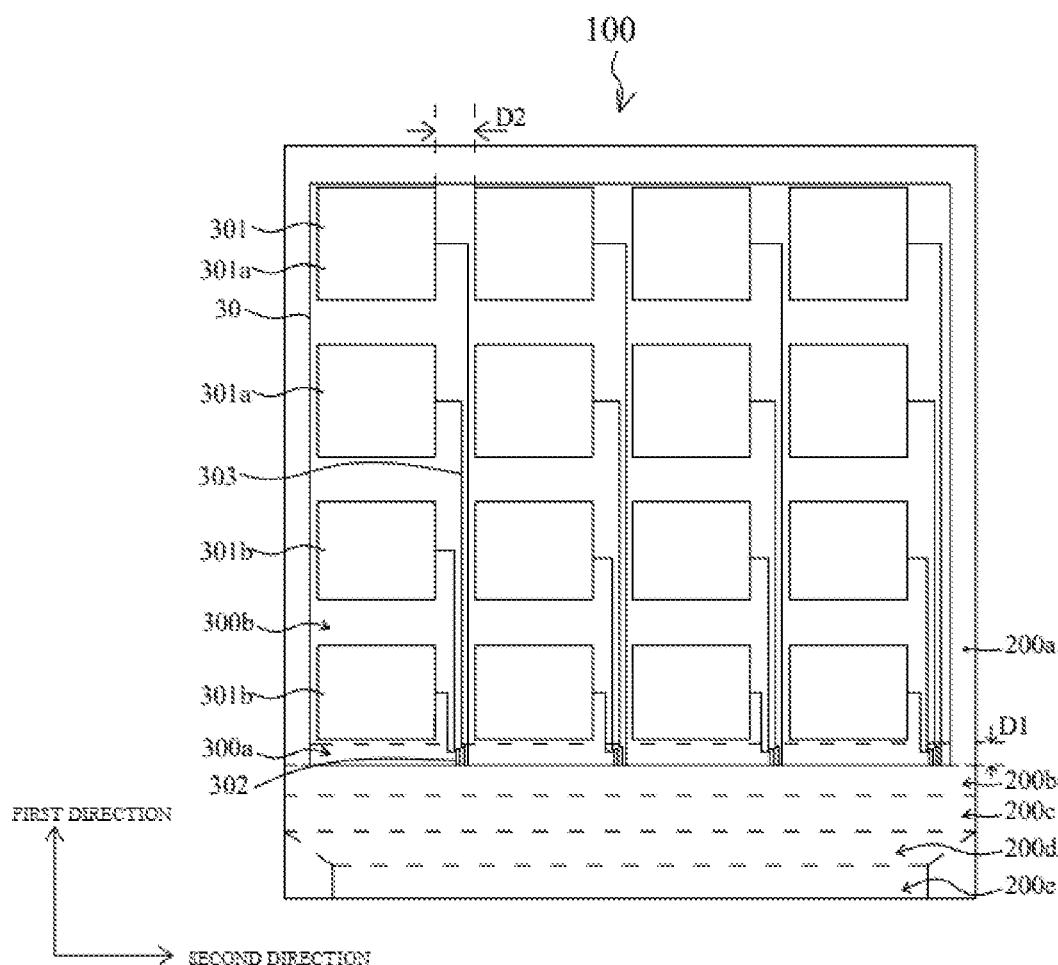
FIG. 6 is a second schematic plan view of the touch display panel according to an embodiment of the present disclosure.

As shown in FIG. 6, which is a second schematic plan view of the touch display panel according to an embodiment of the present disclosure. The touch display panel shown in FIG. 6 is basically similar to the touch display panel shown in FIG. 3, except that the plurality of touch electrodes 301 in FIG. 6 comprise a plurality of rows of adjacent second type touch electrodes 301b. The plurality of rows of adjacent second type touch electrodes 301b are disposed close to the first area 300a. Specifically, two adjacent rows of second type touch electrodes 301b are disposed close to the first area 300a.

Figure 7:
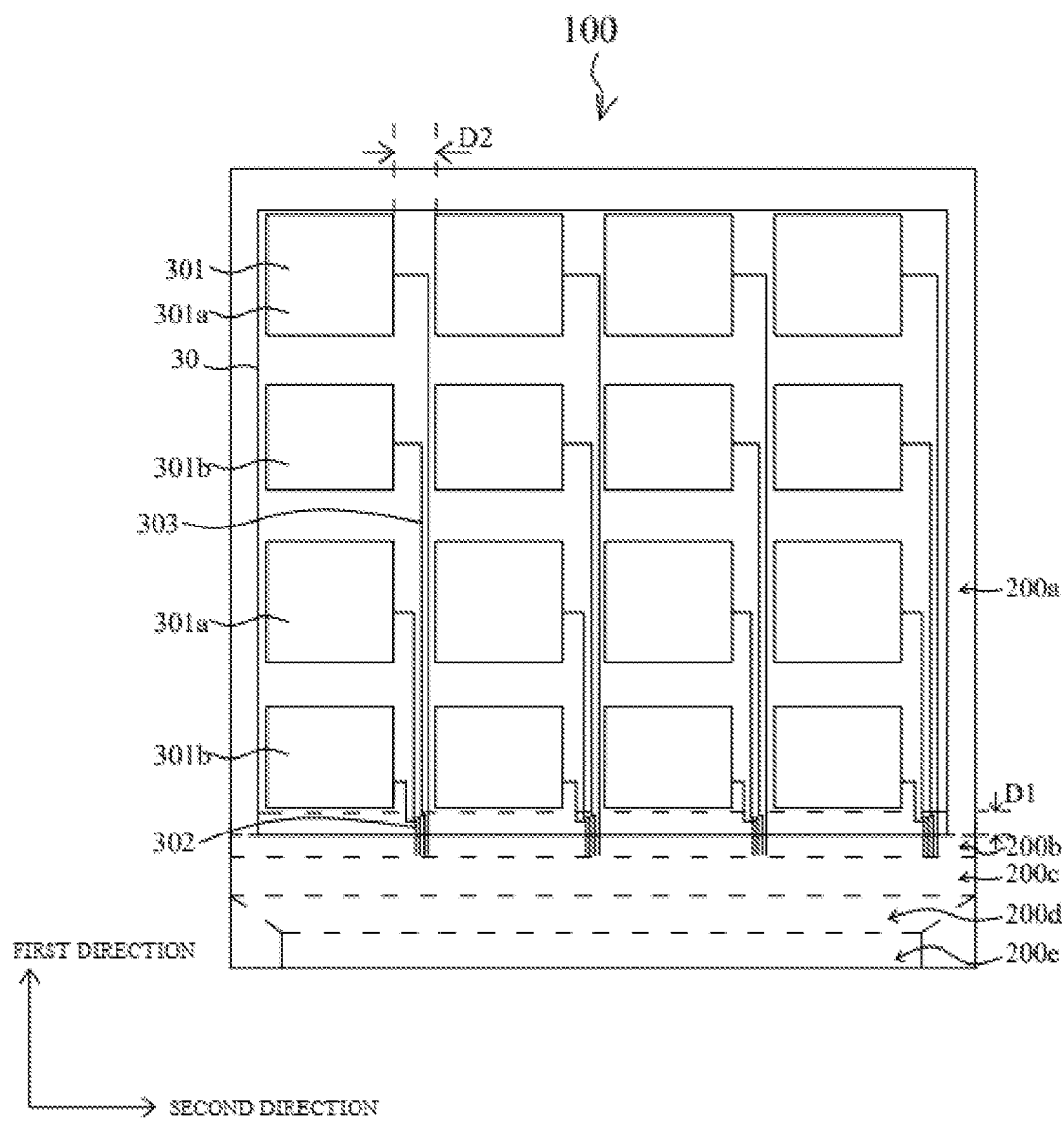
FIG. 7 is a third schematic plan view of the touch display panel according to an embodiment of the present disclosure.

As shown in FIG. 7, which is a third schematic plan view of the touch display panel according to an embodiment of the present disclosure. The touch display panel shown in FIG. 7 is basically similar to the touch display panel shown in FIG. 3, except that a row of second type touch electrodes 301b is disposed between two adjacent rows of first type touch electrodes 301a, and another row of second type touch electrodes 301b is disposed close to the first area 300a.

In this embodiment, in the first direction, the first area 300a has a first size D1, and the first size D1 is equal to an interval between the touch electrodes 301 close to the first touch electrode line 302 and the first edge 2011. In the second direction, an interval between two adjacent first type touch electrodes 301a is equal to a second size D2, and the first size D1 is less than or equal to the second size D2, so that a touch control algorithm can be optimized to ensure the touch performance of the touch display panel, which prevents the touch performance of the lower edge of the touch display panel from decreasing.

Specifically, the second size D2 is less than or equal to 1.2 mm, for example, a value of the first size D1 is 1 mm, 0.8 mm, 0.6 mm, 0.4 mm, or 0.2 mm, and a value of the second size D2 is 1.2 mm, 1 mm. or 0.8 mm.

In this embodiment, in the first direction, a ratio of the size of the second type touch electrodes 301b to the size of the first type touch electrodes 301a is greater than or equal to ½ to ensure that the size of the second type touch electrodes 301b can guarantee basic touch performance. Specifically, the ratio of the size of the second type touch electrodes 301b in the first direction to the size of the first type touch electrodes 301a in the first direction is ¾ or ⅔.

In this embodiment, as shown in FIG. 3, FIG. 6, and FIG. 7, in the first direction, the first type touch electrodes 301a have a first height L1, and the second type touch electrodes 301b have a second height L2. The first area 300a has the first size D1, and a number of the second type touch electrodes 301b arranged in a same row with the at least one first type touch electrode 301a is N, and N is an integer greater than or equal to 1, wherein the first height L1, the second height L2, the first size D1, and N satisfy a formula L2=L1−D1/N, so as to make full use of extra space by reducing the height of some of the touch electrodes. Specifically, a value of the first height L1 of the first type touch electrodes 301a ranges from 3 mm to 5 mm, and a value of the second height L2 of the second type touch electrodes 301b ranges from 2.5 mm to 4.5 mm. For example, the first height L1 of the first type touch electrodes 301a is 4 mm, and the second height L2 of the second type touch electrodes 301b is 3 mm.

Figure 8:
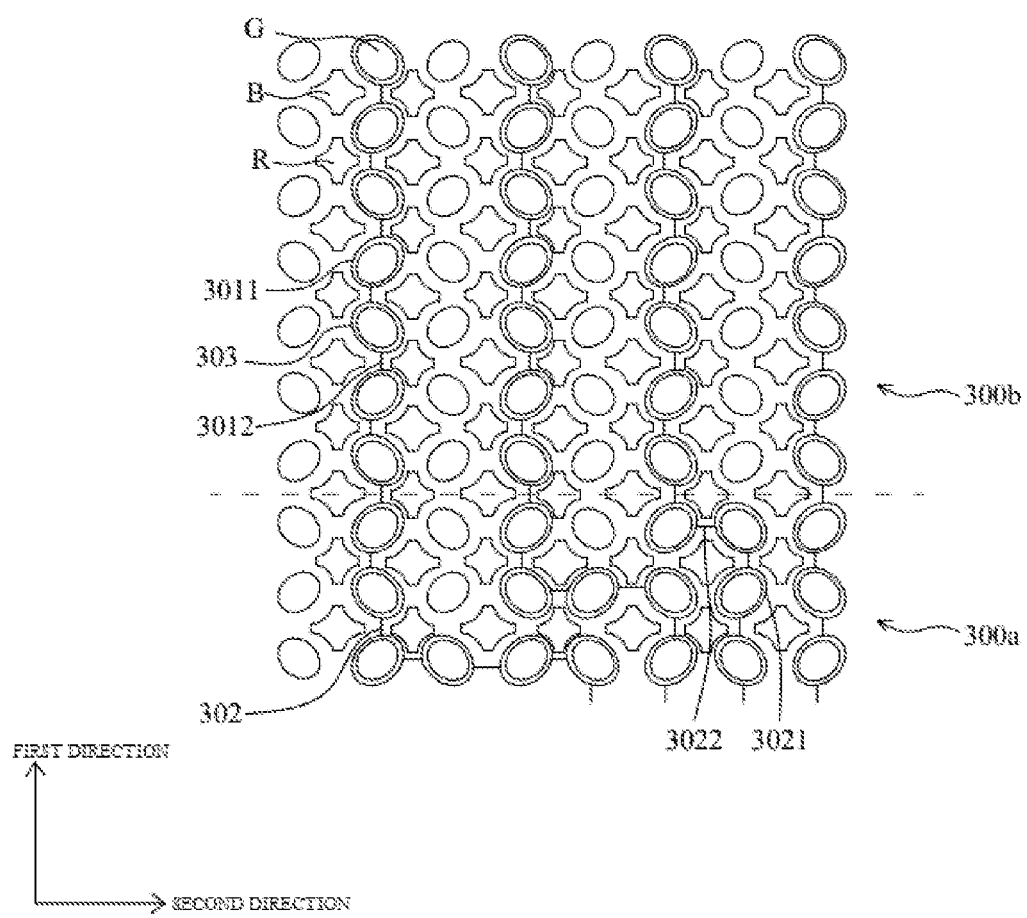
FIG. 8 is a first partial enlarged schematic view of the touch display panel shown in FIG. 3.

In this embodiment, the plurality of first touch electrode lines 302 are disposed in a non-luminous area between adjacent sub-pixels, so as to prevent the plurality of first touch electrode lines 302 from blocking light emitted by the sub-pixels of the display panel 20. Specifically, as shown in FIG. 8, which is a first partial enlarged schematic view of the touch display panel shown in FIG. 3, both the first touch electrode lines 302 and the second touch electrode lines 303 are comprised of metal grid patterns. The second touch electrode lines 303 extend linearly in the first direction. The second touch electrode lines 303 comprise the elliptical ring patterns 3011 and the first connection portions 3012. A part of the first touch electrode lines 302 extend linearly in the first direction, and the part of the first touch electrode lines 302 are parallel to the second touch electrode lines 303. A part of the first touch electrode lines 302 extend in the first direction in a shape of a broken line, and the part of the first touch electrode lines 302 comprise first wires 3021 parallel to the second touch electrode lines 303 and second wires 3022 perpendicular to the second touch electrode lines 303, the part of the first touch electrode lines 302 are L-shaped or Z-shaped, and the part of the first touch electrode lines 302 comprise the elliptical ring patterns 3011, the first connection portions 3012, and the second connection portions 3013.

Figure 9:
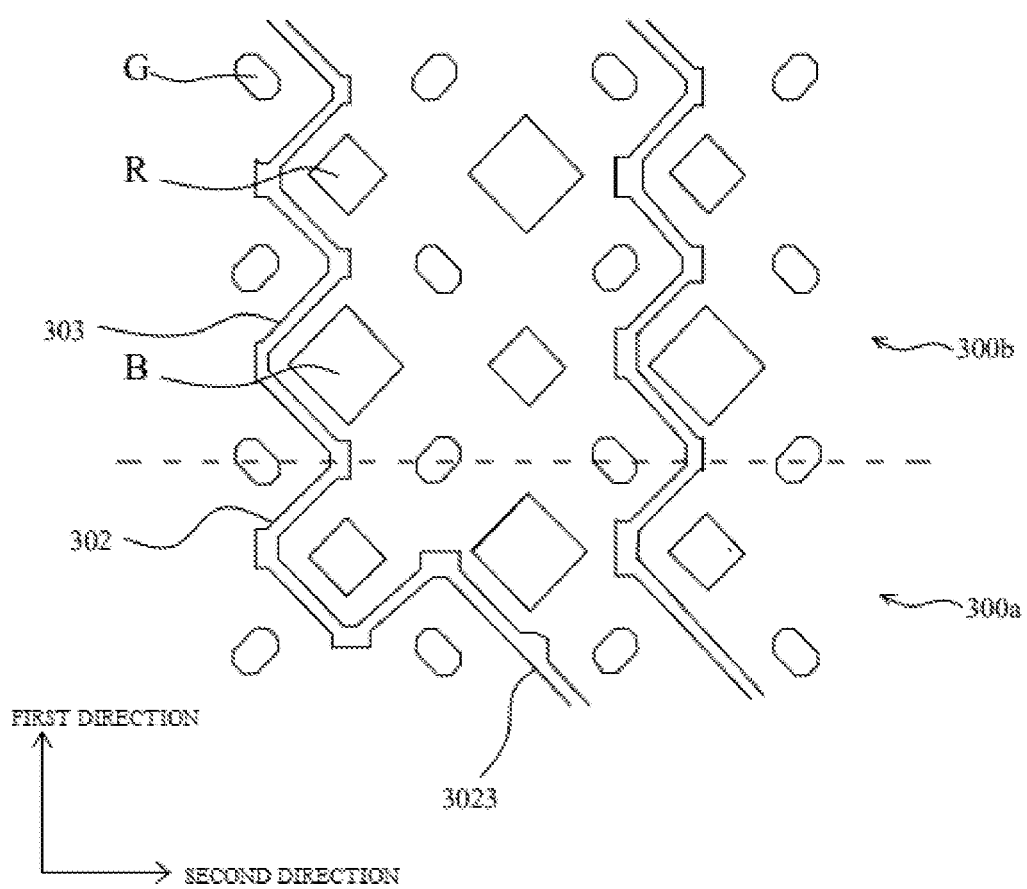
FIG. 9 is a second partial enlarged schematic view of the touch display panel shown in FIG. 3.

As shown in FIG. 9, which is a second partial enlarged schematic view of the touch display panel shown in FIG. 3, the touch display panel shown in FIG. 9 is basically similar to the touch display panel shown in FIG. 8, except that the touch electrode lines 302 and the second touch electrode lines 303 are both composed of straight metal lines, and the first touch electrode lines 302 comprise third wires 3023, and the third wires 3023 are in a diagonal shape, and an angle between a line where the third wires 3023 are located and a line where the second touch electrode lines 303 are located is an acute angle.

The description of the above embodiments is only used to help understand the technical solutions and core ideas of the present disclosure; those of ordinary skill in the art should understand that it is still possible to modify the technical solutions recorded in the foregoing embodiments, or equivalently replace some of the technical features, and these modifications or replacements do not cause the essence of the corresponding technical solutions to deviate from the scope of the technical solutions of the embodiments of the present disclosure.

What is claimed is:

1. A touch display panel, wherein the touch display panel comprises:
a display panel comprising a display area, wherein the display panel comprises a plurality of sub-pixels; and
a touch component, wherein the touch component comprises a first area and a second area disposed corresponding to the display area, and the first area is disposed adjacent to the second area, and the touch component comprises:
a plurality of first touch electrode lines disposed in the first area, wherein the plurality of the first touch electrode lines are disposed in a non-luminous area between adjacent sub-pixels;
a plurality of touch electrodes disposed in the second area, wherein the plurality of touch electrodes comprise first type touch electrodes and second type touch electrodes; in a first direction, the second type touch electrodes are arranged side by side with the first type touch electrodes, and a size of the first type touch electrodes is different from a size of the second type touch electrodes, wherein the first direction is a direction in which the second area points to the first area; and
a plurality of second touch electrode lines disposed in the second area, wherein the plurality of second touch electrode lines are connected between the plurality of first touch electrode lines and the plurality of the touch electrodes, and an interval between two adjacent second touch electrode lines is greater than a minimum interval between two adjacent first touch electrode lines;
wherein in the first direction, the first area has a first size D1, and the first size D1 is equal to an interval from the touch electrodes close to the plurality of first touch electrode lines to the first edge; and
in a second direction, an interval between two adjacent first type touch electrodes is equal to a second size D2, and the second direction is perpendicular to the first direction;
wherein the first size D1 is less than or equal to the second size D2.

2. The touch display panel of claim 1, wherein in the first direction, the size of the second type touch electrodes is less than the size of the first type touch electrodes, and the second type touch electrodes are disposed close to a first edge or a second edge, wherein the first edge is an edge of a part of the display panel corresponding to the display area close to the plurality of first touch electrode lines, and the second edge is an edge of the part of the display panel corresponding to the display area opposite to the first edge.

3. The touch display panel of claim 2, wherein the second type touch electrodes are disposed close to the first edge, and the first type touch electrodes are located at a side of the second touch electrodes away from the first edge.

4. The touch display panel of claim 2, wherein in the first direction, a ratio of the size of the second type touch electrodes to the size of the first type touch electrodes is greater than or equal to ½.

5. The touch display panel of claim 2, wherein in the first direction, the first type touch electrodes have a first height L1, the second type touch electrodes have a second height L2, the first area has a first size D1, and a number of the second type touch electrodes disposed in a same row with at least one of the first type touch electrodes is N, wherein N is an integer greater than or equal to 1, and the first size D1 is equal to an interval from the touch electrodes close to the plurality of first touch electrode lines to the first edge;
wherein the first height L1, the second height L2, the first size D1, and N satisfy following formula:

$$L2=L1-D1/N.$$

6. The touch display panel of claim 1, wherein a part of the plurality of first touch electrode lines comprise first wires parallel to the plurality of second touch electrode lines and second wires perpendicular to the plurality of second touch electrode lines.

7. The touch display panel of claim 1, wherein the plurality of touch electrodes, the plurality of first touch electrode lines, and the plurality of second touch electrode lines are all composed of metal grid patterns.

8. A touch display panel, wherein the touch display panel comprises:
a display panel comprising a display area; and
a touch component comprising a first area and a second area disposed corresponding to the display area, wherein the first area is disposed adjacent to the second area, and the touch component comprises:
a plurality of first touch electrode lines disposed in the first area;
a plurality of touch electrodes disposed in the second area; and
a plurality of second touch electrode lines disposed in the second area, wherein the plurality of second touch electrode lines are connected between the plurality of first touch electrode lines and the plurality of touch electrodes, and an interval between two adjacent second touch electrode lines is greater than a minimum interval between two adjacent first touch electrode lines;
wherein the plurality of touch electrodes comprises:
first type touch electrodes; and
second type touch electrodes, wherein in a first direction, the second type touch electrodes are arranged side by side with the first type touch electrodes, and a size of the first type touch electrodes is different from a size of the second type touch electrodes, wherein the first direction is a direction in which the second area points to the first area;
wherein in the first direction, the first type touch electrodes have a first height L1, the second type touch electrodes have a second height L2, the first area has a first size D1, and a number of the second type touch electrodes disposed in a same row with at least one of the first type touch electrodes is N, wherein N is an integer greater than or equal to 1, and the first size D1 is equal to an interval from the touch electrodes close to the plurality of first touch electrode lines to the first edge;
wherein the first height L1, the second height L2, the first size D1, and N satisfy following formula:

$$L2=L1-D1/N.$$

9. The touch display panel of claim 8, wherein in the first direction, the size of the second type touch electrodes is less than the size of the first type touch electrodes, and the second type touch electrodes are disposed close to a first edge or a second edge, wherein the first edge is an edge of a part of the display panel corresponding to the display area close to the plurality of first touch electrode lines, and the second edge is an edge of the part of the display panel corresponding to the display area opposite to the first edge.

10. The touch display panel of claim 9, wherein the second type touch electrodes are disposed close to the first edge, and the first type touch electrodes are located at a side of the second touch electrodes away from the first edge.

11. The touch display panel of claim 9, wherein in the first direction, the first area has a first size D1, and the first size D1 is equal to an interval from the touch electrodes close to the plurality of first touch electrode lines to the first edge; and in a second direction, an interval between two adjacent first type touch electrodes is equal to a second size D2, and the second direction is perpendicular to the first direction;

wherein the first size D1 is less than or equal to the second size D2.

12. The touch display panel of claim 9, wherein in the first direction, a ratio of the size of the second type touch electrodes to the size of the first type touch electrodes is greater than or equal to ½.

13. The touch display panel of claim 8, wherein the display panel comprises a plurality of sub-pixels, and the plurality of first touch electrode lines are disposed in a non-luminous area between the sub-pixels.

14. The touch display panel of claim 8, wherein a part of the plurality of first touch electrode lines comprise first wires parallel to the plurality of second touch electrode lines and second wires perpendicular to the plurality of second touch electrode lines.

15. The touch display panel of claim 8, wherein the plurality of touch electrodes, the plurality of first touch electrode lines, and the plurality of second touch electrode lines are all composed of metal grid patterns.

* * * * *